US012002531B2

(12) United States Patent
He et al.

(10) Patent No.: US 12,002,531 B2
(45) Date of Patent: Jun. 4, 2024

(54) TECHNIQUES FOR RETIRING BLOCKS OF A MEMORY SYSTEM

(71) Applicant: Micron Technology, Inc., Boise, ID (US)

(72) Inventors: Deping He, Boise, ID (US); Jonathan S. Parry, Boise, ID (US); Chun Sum Yeung, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/648,396

(22) Filed: Jan. 19, 2022

(65) Prior Publication Data

US 2023/0049201 A1    Feb. 16, 2023

Related U.S. Application Data

(60) Provisional application No. 63/233,065, filed on Aug. 13, 2021.

(51) Int. Cl.
| | |
|---|---|
| *G11C 29/42* | (2006.01) |
| *G06F 11/07* | (2006.01) |
| *G11C 29/12* | (2006.01) |
| *G11C 29/20* | (2006.01) |
| *G11C 29/44* | (2006.01) |

(52) U.S. Cl.
CPC .......... *G11C 29/42* (2013.01); *G06F 11/076* (2013.01); *G11C 29/1201* (2013.01); *G11C 29/20* (2013.01); *G11C 29/4401* (2013.01)

(58) Field of Classification Search
None
See application file for complete search history.

(56) References Cited

U.S. PATENT DOCUMENTS

| | | | | |
|---|---|---|---|---|
| 2013/0346812 A1* | 12/2013 | Bahirat | ............... | G11C 16/349 714/704 |
| 2014/0059406 A1* | 2/2014 | Hyun | .................. | G11C 11/5628 714/773 |
| 2015/0033087 A1* | 1/2015 | Marquart | ............ | G06F 11/1048 714/718 |
| 2019/0294368 A1* | 9/2019 | Hiraishi | .................. | G06F 3/064 |

* cited by examiner

*Primary Examiner* — Guerrier Merant
(74) *Attorney, Agent, or Firm* — Holland & Hart LLP

(57) ABSTRACT

Methods, systems, and devices for techniques for retiring blocks of a memory system are described. In some examples, aspects of a memory system or memory device may be configured to determine an error for a block of memory cells. Upon determining the occurrence of the error, the memory system may identify one or more operating conditions associated with the block. For example, the memory system may determine a temperature of the block, a cycle count of the block, a quantity of times the block has experienced an error, a bit error rate of the block, and/or a quantity of available blocks in the associated system. Depending on whether a criteria associated with a respective operating condition is satisfied, the block may be enabled or retired.

25 Claims, 5 Drawing Sheets

TECHNIQUES FOR RETIRING BLOCKS OF A MEMORY SYSTEM

CROSS REFERENCE

The present Application for patent claims the benefit of U.S. Provisional Patent Application No. 63/233,065 by H E et al., entitled "TECHNIQUES FOR RETIRING BLOCKS OF A MEMORY SYSTEM," filed Aug. 13, 2021, assigned to the assignee hereof, and expressly incorporated by reference herein.

FIELD OF TECHNOLOGY

The following relates generally to one or more systems for memory and more specifically to techniques for retiring blocks of a memory system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Memory systems may include one or more memory devices that include an array of memory cells and circuitry operable to perform access operations on the memory cells. Various structures of a memory device (e.g., of a memory die) may wear or degrade over time, which may lead to operational failures or otherwise unreliable operation of the memory device. Some memory systems or memory devices may be configured to detect indications of unreliable or failed access operations, and retire portions of a memory array in response to such detections. However, some techniques for detecting unreliable or failed access operations may be overly conservative and lead to excessive retirement of a memory array.

In accordance with examples as disclosed herein, aspects of a memory system or memory device may be configured to determine the occurrence of an error for a block of memory cells. Upon detecting the occurrence of the error, the block may be retired based on one or more operating conditions satisfying a criteria. In some instances, a determination of whether to retire a block may be made based on operating conditions that may be associated with (e.g., occurring concurrently with) detecting the one or more errors. Example of operating conditions may include a temperature of the block, a cycle count of the block, a quantity of times the block has experienced an error, a bit error rate of the block, and/or a quantity of available blocks in the associated system. Each operating condition may be associated with respective criteria for retiring the block. Accordingly, the associated memory system may retire blocks relatively more or less aggressively based on an operating condition satisfying (or failing to satisfy) a respective criteria. Compared to other techniques for of array retirement, by implementing one or more aspects of temporarily retiring blocks in accordance with examples as disclosed herein, a memory device may be configured with a larger capacity, a smaller degree of over-provisioning, or a longer life cycle, among other benefits or combinations thereof.

Figure 1:
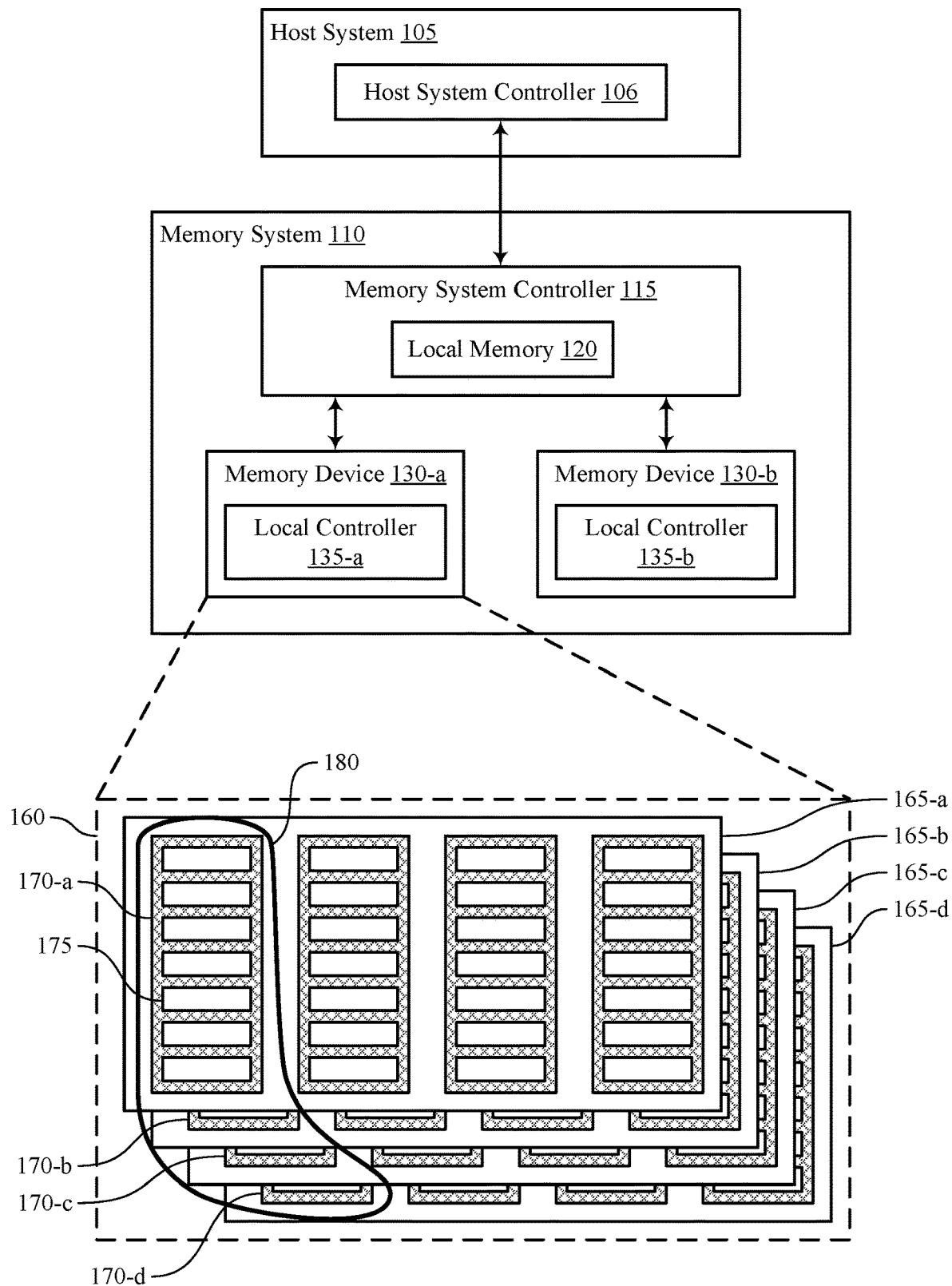
FIG. 1 illustrates an example of a system that supports techniques for retiring blocks of a memory system in accordance with examples as disclosed herein.
Figure 2:
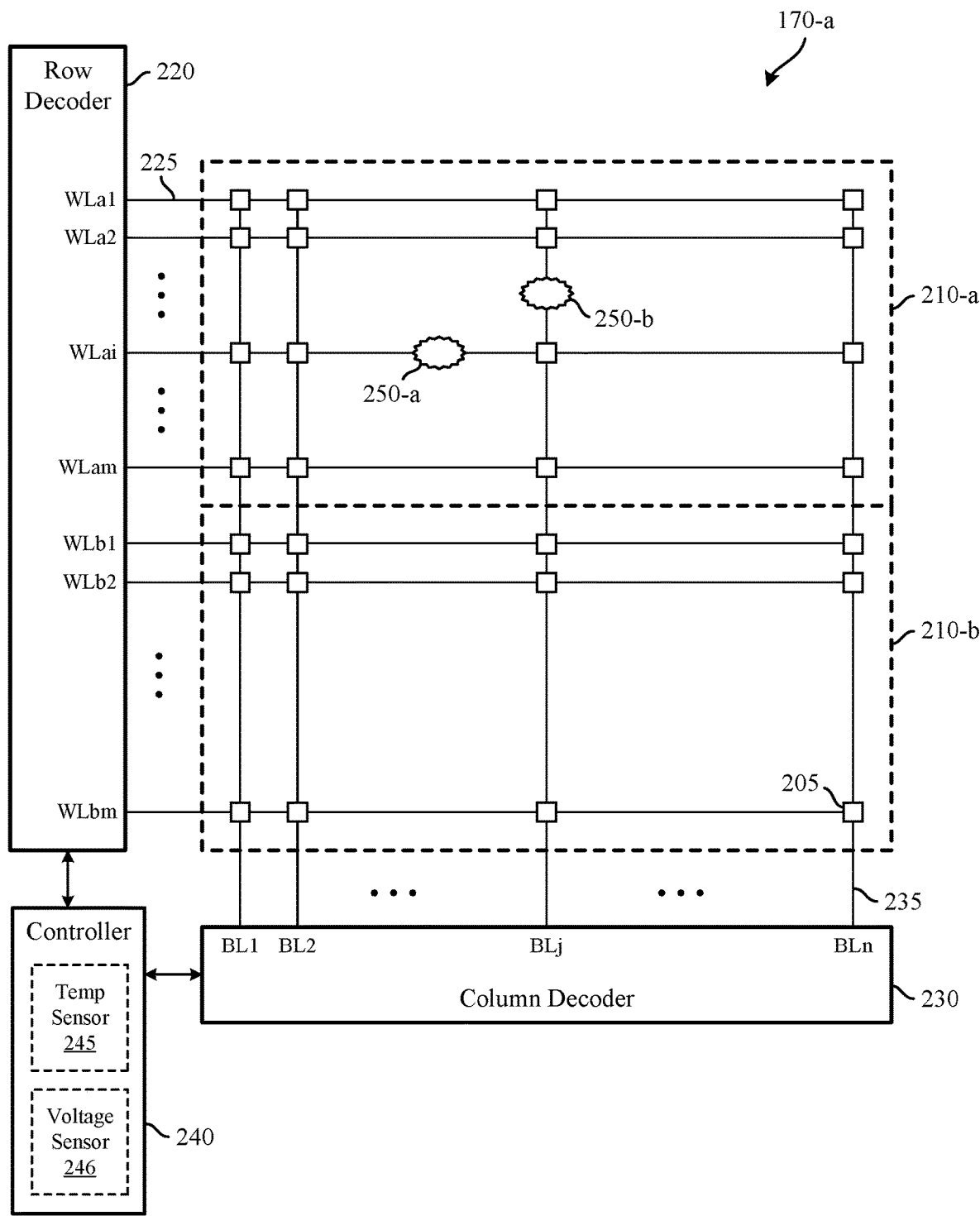
FIG. 2 illustrates a block diagram of a circuit that supports techniques for retiring blocks of a memory system in accordance with examples as disclosed herein.

Features of the disclosure are initially described in the context of systems, devices, and circuits with reference to FIGS. 1 and 2. Features of the disclosure are described in the context of a process flow diagram with reference to FIG. 3. These and other features of the disclosure are further illustrated by and described in the context of an apparatus diagram and a flowchart that relate to techniques for retiring blocks of a memory system with reference to FIGS. 4 and 5.

FIG. 1 illustrates an example of a system 100 that supports techniques for retiring blocks of a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165 c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support techniques for managing temporarily retired blocks of a memory system. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The memory system controller 115 may be configured to determine an occurrence of an error on one or more blocks 170 of memory cells. Upon determining an error on a block 170, the memory system controller 115 may identify one or more operating conditions associated with the block 170. For example, the memory system controller 115 may determine a temperature of the block 170 (or other components of the memory system), a cycle count of the block 170, a quantity of times the block 170 has experienced an error, a bit error rate of the block 170, and/or a quantity of available blocks 170 in the memory system 110. Depending on whether a criteria associated with a respective operating condition is satisfied, the block 170 may be enabled or retired. Accordingly, by determining whether a respective criteria associated with one or more operating conditions is satisfied, the memory system controller 115 may retire blocks 170 relatively more or less aggressively than just using errors in the data to retire blocks. Thus the memory system 110 may be configured with a larger capacity, a smaller degree of over-provisioning, or a longer life cycle, among other benefits.

FIG. 2 illustrates a block diagram of a circuit 200 that supports techniques for retiring blocks of a memory system in accordance with examples as disclosed herein. The circuit 200 may be included in a memory system 110, and may include one or more components of a memory device 130. For example, the circuit 200 illustrates an example of a block 170-a including an array of memory cells 205. Each of the memory cells 205 may be located at or otherwise accessible according to an intersection of a word line 225 (e.g., a WL) and a bit line 235 (e.g., a BL), which may each be referred to as access lines of the block 170-a. Memory cells 205 along a word line 225 may be an example of a page 175. The word lines 225 and bit lines 235 may be coupled with a row decoder 220 and a column decoder 230, respectively, for controlling various biasing or activation of the respective access lines. In some examples, the row decoder 220 and the column decoder 230 may be components of a local controller 135, which may support access operations such as writing logic states to memory cells 205 or sensing logic states stored in memory cells 205, among other operations and signaling thereof. The row decoder 220 and the column decoder 230 may be coupled with a controller 240 that is configured to perform various techniques for topology-based retirement as disclosed herein. In various examples, the controller 240 may be included in a memory system controller 115, included in a local controller 135, or distributed between a memory system controller 115 and a local controller 135, among other configurations.

The memory cells 205 may be physically or electrically arranged according to subblocks 210 (e.g., a first subblock 210-a and a second subblock 210-b). In some examples, each of the subblocks 210 may include or refer to a subset of the word lines 225 of a block 170 (e.g., subblock 210-a including or associated with word lines WLa1 through WLam, subblock 210-b including or associated with word lines WLb1 through WLbm). Although the block 170-a is illustrated as including two subblocks 210, a block 170 in accordance with the described techniques may include any quantity of subblocks 210 (e.g., two, three, four, five, six, seven, eight, etc.). Additionally or alternatively, although the subblocks 210 are illustrated as each including a respective subset of the word lines 225 of the block 170-a and all of the bit lines 235 of the block 170-a, in some examples, subblocks 210 may each include a respective subset of the bit lines 235 of a block 170 (e.g., in combination with including some or all of the word lines 225 of the block 170).

In some examples, one or more structures of the circuit 200 (e.g., structures of a die 160) may wear or degrade over time, which may lead to one or more physical defects. For example, circuit 200 illustrates an example of a defect 250-a, which may be associated with at least a word line WLai, and a defect 250-b, which may be associated with at least a bit line BLj. The defects 250 may refer to various degradation or failure of one or more physical elements of the circuit 200. For example, a defect 250 may refer to a short circuit defect or other dielectric breakdown (e.g., a leakage path), such as a short circuit between an access line and a chassis or ground structure of a die 160, a short circuit between an access line and a voltage source (e.g., a positive voltage source, a negative voltage source), a short circuit between a first access line and a second access line (e.g., between a first word line 225 and a second word line 225, between a first bit line 235 and a second bit line 235, between a word line 225 and a bit line 235), or between other structures of the circuit 200. In some examples, a defect 250 may refer to an open circuit defect or other reduction or suppression of conductivity, such as a break in conductivity or a break or other cross-sectional reduction in a conductive path of an access line. The examples of defects 250-a and 250-b are for illustrative purposes, and a circuit may develop any quantity of one or more defects 250 in various locations of a circuit of a memory device 130, and a defect 150 may affect any quantity of one or more access lines.

In some examples, a defect 250 may cause errors in response to accessing memory cells 205 of the block 170-a, which may include uncorrectable errors (e.g., if a quantity of errors exceeds an error correction capability of a memory system 110 or a memory device 130 that includes the circuit 200, if an error is not due to a temporary condition). For example, if the defect 250-a is an open circuit defect, the defect 250-*a* may cause errors in response to accessing memory cells 205 along the word line WLai that are downstream of the defect 250-*a* (e.g., downstream relative to the row decoder, farther from the row decoder 220 than the defect 250-*a*) due to signals not being conveyed through the defect 250-*a*). Likewise, if the defect 250-*b* is an open circuit defect, the defect 250-*b* may cause errors in response to accessing memory cells 205 along the bit line BLj that are downstream of the defect 250-*b* (e.g., downstream relative to the column decoder 230, farther from the column decoder 230 than the defect 250-*b*) due to signals not being conveyed through the defect 250-*b*). In examples where a defect 250 is a short circuit, dielectric breakdown, or leakage defect associated with an access line, such a defect 250 may cause errors in response to accessing both memory cells 205 that are downstream of the defect 250 and memory cells 205 that are upstream of the defect 250 (e.g., to voltage instability or charge leakage that generally affects signaling of the access line).

In some examples, the controller 240 may manage one or more mappings for tracking enabled blocks 170 and retired blocks 170 (e.g., permanently retired blocks 170). As used herein, an enabled block 170 may refer to any block 170 that is actively configured to store data. For example, data may be read from or written to an active block 170. A retired block 170 may refer to a block that is no longer configured to be accessed. For example, a block 170 may have experienced one or more errors (e.g., uncorrectable errors, uncorrectable error control code (ECC) errors) and thus may no longer be able to reliably store data. These blocks 170 may be retired such that data may no longer be read from or written them.

In other examples, the controller 240 may manage any quantity of mappings for tracking the status of blocks 170. For example, the controller 240 may manage mapping tables for blocks 170 having experienced different types of errors, such as uncorrectable errors, performance errors (e.g., blocks 170 performing relatively slowly), or blocks being designated as having errors during factory testing.

Whether a block 170 is retired may be based on the occurrence of an error and whether a criteria associated with an operating condition is satisfied. For example, some blocks 170 may experience errors that are transient in nature. Blocks 170 that are storing relatively old data may experience data retention problems that may not otherwise occur but for the data being stored to the block 170 for a relatively long duration. Similarly, some blocks 170 may experience temperature variations (e.g., as measured or detected by a temperature sensor 245) or voltage variations (e.g., as measured or detected by a voltage sensor 246) that may cause temporary (e.g., transient) errors that may not affect the long-term reliability of the block 170. Accordingly, if a block 170 experiences an error, one or more operating conditions associated with the block 170 may be identified and compared with respective criteria. If the criteria are satisfied, the block 170 may be retired (e.g., an index associated with the block may be stored to a mapping for tracking retired blocks 170). Conversely, if one or more of the criteria are not satisfied, the block 170 may remain enabled (e.g., an index associated with the block may be stored or remain stored to a mapping for tracking enabled blocks 170).

In some examples, the controller 240 may determine an occurrence of an error of a block 170-*a* (e.g., an enabled block 170). Upon determining the error, the controller 240 may identify one or more operating conditions associated with the block 170-*a*. As described herein, the operating conditions of the block 170-*a* may relate to a temperature of the block 170-*a*, a cycle count of the block 170-*a*, a quantity of times the block 170-*a* has experienced an error, a bit error rate of the block 170-*a*, and/or a quantity of available blocks 170 in the memory system 110. Moreover, each operating condition may be associated with a respective criteria for determining whether to retire the block 170-*a*, and multiple operating conditions may be used to determine whether to retire the block 170-*a*. For example, the block 170-*a* may be retired if both an operating temperature satisfies a temperature threshold and a cycle count satisfies a cycle count threshold, but remain enabled if one of the two criteria are not satisfied.

By utilizing one or more operating conditions to determine whether to retire the block 170-*a*, the memory system 110 may be able to retire blocks 170 more or less aggressively. For example, the block 170-*a* may undergo testing where it is exposed to relatively high or low temperatures. Accordingly, the block 170-*a* may experience errors, but the errors may be transient in nature due to changing operating conditions (such as high or low temperatures, to name one example). In some cases, a temperature threshold may be set such that, if an operating temperature of the block 170-*a* exceeds the temperature threshold the block may remain enabled. Additionally or alternatively, if the temperature threshold is not exceeded (e.g., if the operating temperature of the block 170-*a* is relatively high, but not as high as the threshold), the error may be unexpected and it may be desirable to retire the block 170-*a*.

The criteria for other operating conditions may be set similarly such that blocks 170 may be retired more or less aggressively based on various criteria. For example, criteria associated with a cycle count of a block 170, a quantity of times a block has experienced an error, or bit error rates of a block 170 may be set such that relatively low values (e.g., relatively few access operations, relatively few errors, relatively low bit error rates) may not trigger the retirement of a block 170. Moreover, a block 170 may be retired if the memory system 110 includes a relatively large quantity of available blocks, and may remain enabled if the memory system 110 includes a relatively low quantity of available blocks. Accordingly, by determining whether a respective criteria associated with one or more operating conditions is satisfied, the controller 240 may retire blocks 170 relatively more or less aggressively. Thus the memory system 110 may be configured with a larger capacity, a smaller degree of over-provisioning, or a longer life cycle, among other benefits.

Figure 3:
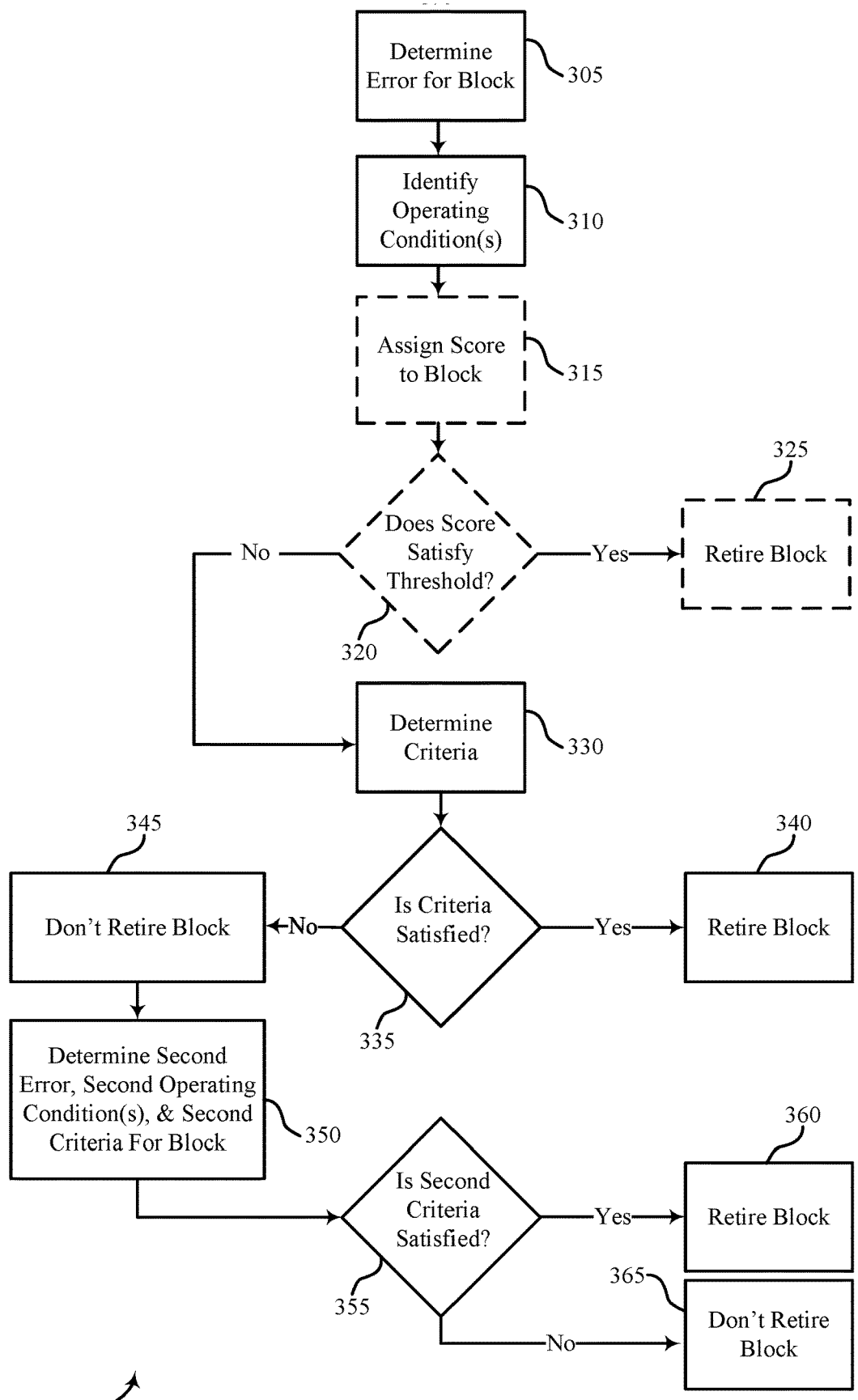
FIG. 3 illustrates an example of a process flow diagram that supports techniques for retiring blocks of a memory system in accordance with examples as disclosed herein.

FIG. 3 illustrates an example of a process flow diagram illustrating a method 300 that supports techniques for retiring blocks of a memory system in accordance with examples as disclosed herein. Aspects of the method 300 may be implemented by a controller (e.g., a memory system controller 115, a local controller 135, a controller 240), among other components. Additionally or alternatively, aspects of the method 300 may be implemented as instructions stored in memory (e.g., firmware stored in a memory coupled with a memory system 110 or a memory device 130). For example, the instructions, if executed by a controller, may cause the controller to perform the operations of the method 300.

In some examples, the method 300 may begin (e.g., be initiated) at 305 based on the determination of an error for a block 170-*a*. For example, the method 300 may begin in response to a controller 240 determining an error condition, such as a read error (e.g., of the block 170-*a*), which may be determined during the course of normal operations (e.g., during a read operation performed in response to a read command from a host system 105), media management operations (e.g., a garbage collection operation, a wear leveling operation), or other operations.

At 310, one or more operating may be identified. As described herein, the operating conditions may include a temperature of the block 170-*a*, a cycle count of the block 170-*a*, a quantity of times the block 170-*a* has experienced an error, a bit error rate of the block 170-*a*, or a quantity of available blocks 170-*a* in the memory system 110. In some instances, multiple operating conditions may be utilized to determine whether to retire the block 170-*a*. Thus, at 310, the controller 240 may identify each of the operating conditions to be utilized in determining whether to retire the block 170-*a*. In other examples, the controller 240 may identify additional operating conditions, although some may be used in determining whether to retire the block 170-*a*.

At 315, the controller 240 may assign a score to the block 170-*a*. In some examples, the score may be assigned based on a comparison of the identified operating condition(s) relative to a respective threshold value. The score may be based on a comparison of the operating temperature of the block 170-*a*, the cycle count of the block 170-*a*, the quantity of times the block 170-*a* has experienced an error, a bit error rate of the block 170-*a*, or a quantity of available blocks 170-*a* in the memory system to respective threshold values. In some instances, a weighted score may be assigned based on different weighted values associated with each of the operating conditions.

For example, a relatively low operating temperature, a relatively high cycle count, a relatively large quantity of errors incurred, a relatively high bit error rate, and a relatively low quantity of available blocks 170 in the memory system 110 may result in a relatively high score. Conversely, a relatively high operating temperature, a relatively low cycle count, a relatively low quantity of errors incurred, a relatively low bit error rate, and a relatively high quantity of available blocks 170 in the memory system 110 may result in a relatively low score. The score may be used to determine whether to retire the block 170-*a*.

In some instances, the operating temperature of a block 170 may be used to determine whether to retire the block. For example, a temperature sensor 245 may be used to determine the temperature of the block upon the occurrence of the error. If the temperature of the block 170 is relatively high (e.g., higher than a temperature threshold) then the block 170 may not be retired, whereas if the temperature of the block 170 is relatively low (e.g., lower than the temperature threshold) then the block 170 may be retired. In some examples, the block 170 may not be retired due to a relatively high operating temperature (or a relatively now operating temperature) because the temperature may have caused the error. That is, the error may be transient in nature due to the relatively high temperature or the relatively low temperature. In some examples the temperature threshold used to determine whether to retire a block 170 may be a configurable threshold. In some cases, the operating temperature of the block 170 may be approximated by measuring the temperature of other locations of the memory system. For example, one or more temperature sensors in any location of the memory system may be used to determine the operating temperature.

Additionally or alternatively, the cycle count of a block 170 may be used to determine whether to retire the block. As described herein, a "cycle count" may refer to a single program erase (P/E) operation performed on a block 170. In some examples, the controller 240 or another component (e.g., a counter) of a memory system may track each time a P/E operation is performed on a respective block 170. If the cycle count of the block 170 is relatively high (e.g., higher than a cycle count threshold) then the block 170 may be retired, whereas if the cycle count of the block 170 is relatively low (e.g., lower than the cycle count threshold) then the block 170 may not be retired. In some examples, the block 170 may be retired due to a relatively high cycle count because blocks 170 tend to degrade after relatively high quantities of PIE operations are performed, thus making it more likely that the detected error is not transient in nature. In some examples the cycle count threshold used to determine whether to retire a block 170 may be a configurable threshold.

In other examples, the quantity of errors of a block 170 may be used to determine whether to retire the block. In some examples, the controller 240 or another component (e.g., a counter) of a memory system may track each time an error is detected for a respective block 170. If the quantity of errors of the block 170 is relatively high (e.g., higher than an error threshold) then the block 170 may be retired, whereas if the quantity of errors of the block 170 is relatively low (e.g., lower than the error threshold) then the block 170 may not be retired. In some examples, the block 170 may be retired due to a relatively high quantity of errors due to a probability that, when a high quantity of errors occurs, the errors are not transient in nature. In some examples the error threshold used to determine whether to retire a block 170 may be a configurable threshold.

In another example, the bit error rate of a block 170 may be used to determine whether to retire the block. In some examples, the controller 240 or another component (e.g., a counter) of a memory system may track each time an error is detected, during a duration, for a respective block 170. The controller 240 or other component may calculate the bit error rate as the number of bit errors divided by the total number of transferred bits during the duration. If the bit error rate of the block 170 is relatively high (e.g., higher than an error rate threshold) then the block 170 may be retired, whereas if the bit error rate of the block 170 is relatively low (e.g., lower than the error rate threshold) then the block 170 may not be retired. In some examples, the block 170 may be retired due to a relatively high bit error rate due to a probability, when a high bit error rate occurs, the errors are not transient in nature. In some examples the error rate threshold used to determine whether to retire a block 170 may be a configurable threshold.

Additionally or alternatively, the quantity of available blocks 170 may be used to determine whether to retire the block. In some examples, the controller 240 or another component (e.g., a counter) of a memory system may track the quantity of available blocks 170 at any given time. To meet some performance benchmarks, a memory system may maintain a quantity of blocks available to perform operations requested by the host system. If the quantity of blocks goes below a threshold, the memory system may perform one or more memory management operations (e.g., garbage collection operation) to make more blocks available for host system operations. As described herein, some blocks may be retired and thus unavailable, while other blocks may be unavailable (e.g., temporarily) due to a garbage collection operation being performed on the block 170. If the quantity of available blocks 170 is relatively high (e.g., higher than a threshold quantity of available blocks 170) then the block 170 may be retired, whereas if the quantity available blocks 170 is relatively low (e.g., lower than the threshold quantity of available blocks 170) then the block 170 may not be retired. In some examples, the block 170 may be retired due to a relatively high quantity of available blocks 170 because the memory system may include a requisite quantity of available blocks for use in subsequent operations (e.g., access operations). In some examples the threshold quantity of available blocks 170 used to determine whether to retire a block 170 may be a configurable threshold.

At 320, the controller 240 may determine whether to retire the block 170-*a* based on whether the score satisfies a threshold value. The controller 240 may compare the score to a threshold value (e.g., a threshold score) to determine whether to retire the block 170-*a*. At 325, the controller 240 may retire the block 170-*a* based on the score. In some examples, the block 170-*a* may be retired based on the score satisfying a threshold value or failing to satisfy a threshold value, which may be a matter of design choice. At 330, the controller 240 may determine to not retire the block 170-*a* based on the score (e.g., the block 170-*a* may remain enabled). In such examples, the block 170-*a* may remain enabled based on the score satisfying a threshold value or failing to satisfy a threshold value, which may be a matter of design choice.

At 330, the controller 240 may determine one or more criteria associated with the identified operating conditions. The controller 240 may determine the criteria if the score does not satisfy a threshold (e.g., at 320), or if a score is not utilized in determining whether to retire the block 170-*a*. By way of example, at 310 the controller may have identified an operating temperature of the block 170-*a*. Accordingly, at 330 the controller 240 may determine as: If operating temperature of the block 170-*a* is less than a threshold temperature value then retire the block 170-*a* and if the operating temperature of the block 170-*a* is greater than the threshold temperature value then do not retire the block 170-*a*.

In some instances, other criteria associated with operating conditions of the block 170-*a* may be as follows.

If a quantity of access operations performed on the block 170-*a* is greater than a threshold quantity of access operations then retire the block 170-*a* and if the quantity of access operations performed on the block 170-*a* is less than the threshold quantity of access operations then do not retire the block 170-*a*.

If the block 170-*a* has experienced a threshold quantity of errors over a duration that is greater than a threshold quantity of errors then retire the block 170-*a* and if the block 170-*a* has experienced a threshold quantity of errors over the duration that is less than the threshold quantity of errors then do not retire the block 170-*a*.

If the block 170-*a* is associated with a bit error rate that is greater than a threshold error rate then retire the block 170-*a* and if the block 170-*a* is associated with a bit error rate that is less than the threshold error rate then do not retire the block 170-*a*.

If the quantity of available blocks 170 of the memory system 110 is greater than a threshold quantity of available blocks 170 then retire the block 170-*a* and if the quantity of available blocks 170 of the memory system 110 is less than the threshold quantity of available blocks 170 then do not retire the block 170-*a*.

At 335, the controller 240 may determine whether to retire the block 170-*a* based on whether the determined criteria is satisfied. The controller 240 may compare the identified operating condition(s) (e.g., a metric or a value associated with the operating condition(s)) to the respective determined criteria. At 340, the controller 240 may retire the block 170-*a* based on the criteria being satisfied. In some instances, if multiple operating conditions are identified and multiple criteria are determined, each criteria may be satisfied in order to retire the block. Using the example described herein, the controller 240 may retire the block 170-*a* based on the operating temperature of the block 170-*a* being less than a threshold temperature value.

At 345, the controller 240 may not retire the block 170-*a* based on the criteria not being satisfied. For example, the controller 240 may not retire the block 170-*a* based on the operating temperature of the block 170-*a* being greater than the threshold temperature value. In such an example, the error may be transient in nature due to the relatively high operating temperature of the block 170-*a*, thus is may be desirable to maintain the block 170-*a* in an enabled state. In some instances, if multiple operating conditions are identified and multiple criteria are determined, the block 170-*a* may not be retired if one or more of the criteria are not satisfied.

At 350, the controller 240 may determine a second error, a second operating condition, and a second criteria for the block 170-*a*. For example, the controller 240 may identify a second operating condition and determine a criteria associated with the second operating condition based on the block 170-*a* experiencing an error for a second time (e.g., a second error). The operating conditions identified at 350 may be identified from the same set of operating conditions described above at 310, and the determined criteria may be the same or different criteria as described above at 330. In some instances, the second criteria may be different than the criteria described above at 330. For example, as described above: If operating temperature of the block 170-*a* is less than a threshold temperature value then retire the block 170-*a* and if the operating temperature of the block 170-*a* is greater than the threshold temperature value then do not retire the block 170-*a*. However, at 350, the criteria may change to: If operating temperature of the block 170-*a* is greater than a threshold temperature value then retire the block 170-*a* and if the operating temperature of the block 170-*a* is less than the threshold temperature value then do not retire the block 170-*a*. The criteria may change because, in some instances, recurring errors may be less likely to be transient in nature.

At 355, the controller 240 may determine whether to retire the block 170-*a* based on whether the determined second criteria is satisfied. The controller 240 may compare the identified operating condition(s) (e.g., a metric or a value associated with the operating condition(s)) to the respective determined second criteria. At 360, the controller 240 may retire the block 170-*a* based on the second criteria being satisfied. In some instances, if multiple operating conditions are identified and multiple criteria are determined, each criteria may be satisfied in order to retire the block.

At 365, the controller 240 may not retire the block 170-*a* based on the criteria not being satisfied. In some instances, if multiple operating conditions are identified and multiple criteria are determined, the block 170-*a* may not be retired if one or more of the criteria are not satisfied. Moreover, the controller 240 may continue determining errors for the block 170-*a* and may continue to determine whether to maintain the block 170-*a* as enabled or retire the block 170-*a* as described herein.

As described herein, multiple operating conditions and associated criteria may be used to determine whether to retire a block 170 that has incurred an error. For example, a block 170 may be retired based on a first criteria and a second criteria being satisfied, whereas the block 170 may not be retired if either of the first criteria or the second criteria are not satisfied.

In some instances, the operating temperature of a block 170 may be a primary operating condition that is used, in combination with other operating conditions, to determine whether to retire a block 170. For example, the temperature of a block 170 and the cycle count of the block 170 may be used in determining whether to retire the block 170. Thus, if the temperature of the block 170 satisfies a temperature threshold and a quantity of access operations performed on the block 170 satisfies a cycle count threshold, the block 170 may be retired. If the temperature of the block 170 does not satisfy the temperature threshold, if the quantity of access operations performed on the block does not satisfy the cycle count threshold, or both, then the block 170 may not be retired.

In another example, the temperature of a block 170 and a quantity of errors incurred by the block 170 may be used in determining whether to retire the block 170. Thus, if the temperature of the block 170 satisfies a temperature threshold and a quantity of errors, during a duration (e.g., a configurable duration), satisfies an error threshold, the block 170 may be retired. In some instances, the quantity of errors incurred by the block 170 may be tracked (e.g., counted) by the controller 240. If the temperature of the block 170 does not satisfy the temperature threshold, if the quantity of errors during the duration does not satisfy the error threshold, or both, then the block 170 may not be retired.

In yet another example, the temperature of a block 170 and the bit error rate of the block 170 may be used in determining whether to retire the block 170. Thus, if the temperature of the block 170 satisfies a temperature threshold and a bit error rate of the block 170 satisfies an error rate threshold, the block 170 may be retired. If the temperature of the block 170 does not satisfy the temperature threshold, if the bit error rate does not satisfy the error rate threshold, or both, then the block 170 may not be retired.

In yet another example, the temperature of a block 170 and the quantity of available blocks of the memory system 110 may be used in determining whether to retire the block 170. Thus, if the temperature of the block 170 satisfies a temperature threshold and a quantity of available blocks 170 in the memory system 110 satisfies a threshold quantity of available blocks 170, the block 170 may be retired. If the temperature of the block 170 does not satisfy the temperature threshold, if the quantity of available blocks 170 in the memory system 110 does not satisfy the threshold quantity of available blocks 170, or both, then the block 170 may not be retired.

Additionally or alternatively, the quantity of available blocks in the memory system 110 may be a primary operating condition that is used, in combination with other operating conditions, to determine whether to retire a block 170. For example, the quantity of available blocks in the memory system 110 and the cycle count of the block 170 may be used in determining whether to retire the block 170. Thus, if the quantity of available blocks 170 in the memory system 110 satisfies the threshold quantity of available blocks 170 and a quantity of access operations performed on the block 170 satisfies a cycle count threshold, the block 170 may be retired. If the quantity of available blocks 170 in the memory system 110 does not satisfy the threshold quantity of available blocks 170, if the quantity of access operations performed on the block 170 does not satisfy the cycle count threshold, or both, then the block 170 may not be retired.

In another example, the quantity of available blocks in the memory system 110 and a quantity of errors incurred by the block 170 may be used in determining whether to retire the block 170. Thus, if the quantity of available blocks 170 in the memory system 110 satisfies the threshold quantity of available blocks 170 and a quantity of errors, during a duration (e.g., a configurable duration), satisfies an error threshold, the block 170 may be retired. If the quantity of available blocks 170 in the memory system 110 does not satisfy the threshold quantity of available blocks 170, if the quantity of errors during the duration does not satisfy the error threshold, or both, then the block 170 may not be retired.

In another example, the quantity of available blocks in the memory system 110 and the bit error rate of the block 170 may be used in determining whether to retire the block 170. Thus, if the quantity of available blocks 170 in the memory system 110 satisfies the threshold quantity of available blocks 170 and a bit error rate of the block 170 satisfies an error rate threshold, the block 170 may be retired. If the quantity of available blocks 170 in the memory system 110 does not satisfy the threshold quantity of available blocks 170, if the bit error rate does not satisfy the error rate threshold, or both, then the block 170 may not be retired.

The aforementioned permutations of operating conditions and associated criteria used for determining whether to retire a block 170 are for exemplary purposes only. As such, any combination or quantity of operating conditions and associated criteria may be used to maintain a block 170 as enabled or to retire the block 170. The combination or quantity of operating conditions and associated criteria may be a matter of design choice, and may be selected based on the desired aggressiveness of block 170 retirement, among other criteria. Accordingly, by determining whether a respective criteria associated with one or more operating conditions is satisfied, the controller 240 may retire blocks 170 relatively more or less aggressively. Thus the memory system 110 may be configured with a larger capacity, a smaller degree of over-provisioning, or a longer life cycle, among other benefits.

Figure 4:
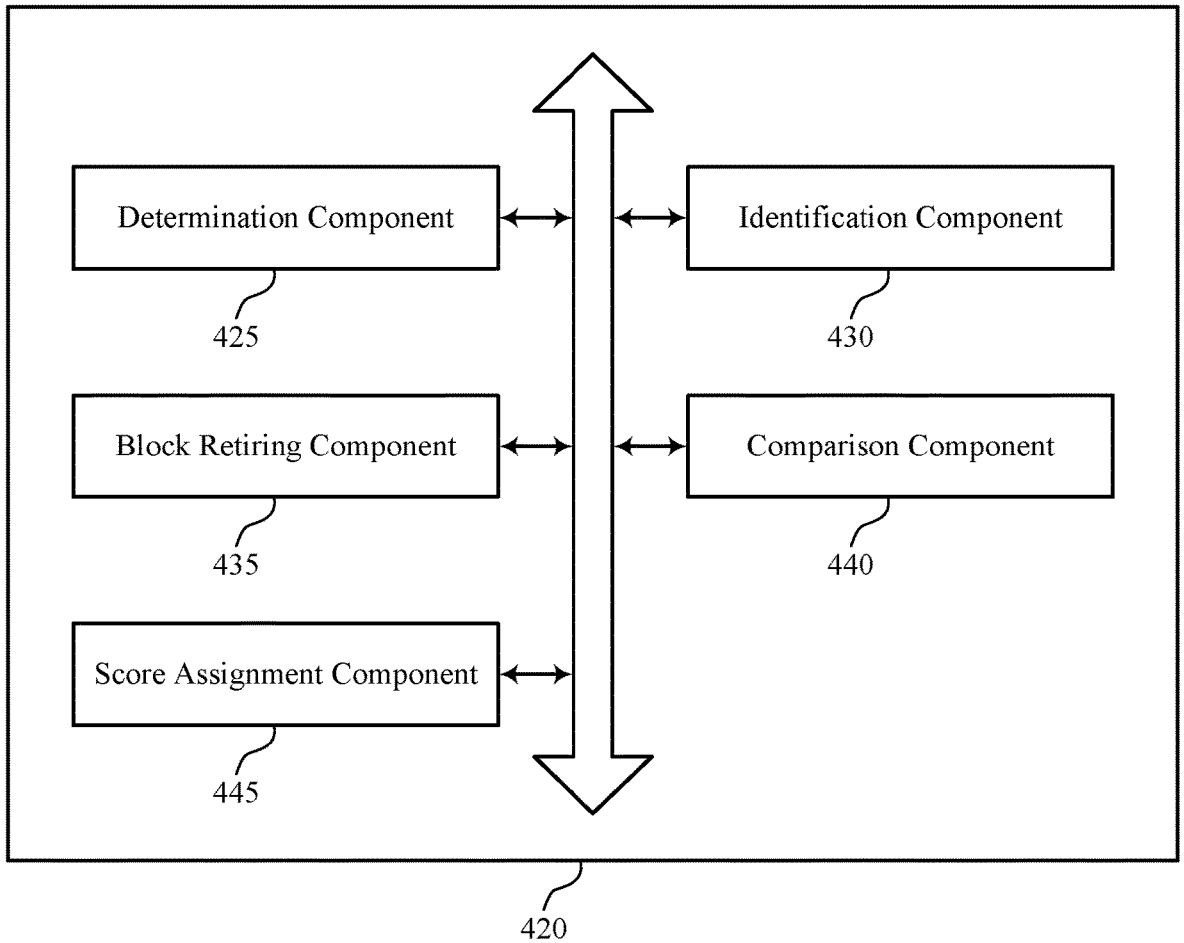
FIG. 4 shows a block diagram of a memory system that supports techniques for retiring blocks of a memory system in accordance with examples as disclosed herein.

FIG. 4 shows a block diagram 400 of a memory system 420 that supports techniques for retiring blocks of a memory system in accordance with examples as disclosed herein. The memory system 420 may be an example of aspects of a memory system as described with reference to FIGS. 1 through 3. The memory system 420, or various components thereof, may be an example of means for performing various aspects of techniques for retiring blocks of a memory system as described herein. For example, the memory system 420 may include a determination component 425, an identification component 430, a block retiring component 435, a comparison component 440, a score assignment component 445, or any combination thereof. Each of these components may communicate, directly or indirectly, with one another (e.g., via one or more buses).

The determination component 425 may be configured as or otherwise support a means for determining an occurrence of at least one error for a block of memory cells of the memory system. In some examples, the determination component 425 may be configured as or otherwise support a means for determining an occurrence of at least one error for a second block of memory cells of the memory system.

In some examples, to support determining whether to retire the block of memory cells, the determination component 425 may be configured as or otherwise support a means for determining whether a temperature of the block of memory cells satisfies a temperature threshold. In some examples, to support determining whether to retire the block of memory cells, the determination component 425 may be configured as or otherwise support a means for determining whether a quantity of access operations performed on the block of memory cells satisfies a cycle count threshold.

In some examples, to support determining whether to retire the block of memory cells, the determination component 425 may be configured as or otherwise support a means for determining whether a quantity of errors, during a duration, for the block of memory cells satisfies an error threshold. In some examples, to support determining whether to retire the block of memory cells, the determination component 425 may be configured as or otherwise support a means for determining whether a bit error rate of the block of memory cells satisfies an error rate threshold.

In some examples, the determination component 425 may be configured as or otherwise support a means for determining whether to retire the block of memory cells based at least in part on determining the occurrence of the at least one error and identifying the one or more operating conditions associated with the block of memory cells of the memory system. In some examples, to support determining whether to retire the block of memory cells, the determination component 425 may be configured as or otherwise support a means for determining whether a quantity of available blocks of memory cells of the memory system satisfies a threshold quantity of available blocks.

In some examples, the determination component 425 may be configured as or otherwise support a means for determining a second occurrence of at least one error for the second block of memory cells of the memory system after refraining from retiring the second block of memory cells. In some examples, the determination component 425 may be configured as or otherwise support a means for determining the criteria based at least in part on identifying the one or more operating conditions associated with the block of memory cells of the memory system. In some examples, the determination component 425 may be configured as or otherwise support a means for determining a third occurrence of at least one error for the block of memory cells of the memory system.

The identification component 430 may be configured as or otherwise support a means for identifying one or more operating conditions associated with the block of memory cells of the memory system based at least in part on determining the occurrence of the at least one error. In some examples, the identification component 430 may be configured as or otherwise support a means for identifying a second set of operating conditions associated with the second block of memory cells of the memory system based at least in part on determining the occurrence of the at least one error for the second block of memory cells. In some examples, the identification component 430 may be configured as or otherwise support a means for identifying a third operating condition associated with the block of memory cells of the memory system based at least in part on determining the occurrence of the at least one error.

The block retiring component 435 may be configured as or otherwise support a means for retiring the block of memory cells based at least in part on the block of memory cells including the at least one error and the one or more operating conditions associated with the block of memory cells of the memory system satisfying a criteria. In some examples, the block retiring component 435 may be configured as or otherwise support a means for refraining from retiring the second block of memory cells based at least in part on the second set of operating conditions associated with the block of memory cells of the memory system failing to satisfy a second criteria.

In some examples, the block retiring component 435 may be configured as or otherwise support a means for retiring second the block of memory cells based at least in part on the second block of memory cells including the second occurrence of the at least one error and the second set of operating conditions associated with the second block of memory cells of the memory system satisfying the second criteria. In some examples, the block retiring component 435 may be configured as or otherwise support a means for retiring the block of memory cells based at least in part on the one or more operating conditions associated with the block of memory cells of the memory system satisfying the criteria and the third operating condition satisfying a third criteria.

In some examples, the block retiring component 435 may be configured as or otherwise support a means for refraining from retiring the block of memory cells based at least in part on the one or more operating conditions associated with the block of memory cells of the memory system failing to satisfy the criteria or the third operating condition failing to satisfy the criteria. In some examples, the block retiring component 435 may be configured as or otherwise support a means for retiring the block of memory cells based at least in part on the score assigned to the block of memory cells of the memory system satisfying a respective threshold value.

In some examples, the comparison component 440 may be configured as or otherwise support a means for comparing the one or more operating conditions associated with the block of memory cells of the memory system to the criteria, where determining whether to retire the block of memory cells is based at least in part on comparing the one or more operating conditions associated with the block of memory cells of the memory system to the respective threshold value.

In some examples, the score assignment component 445 may be configured as or otherwise support a means for assigning a score to the block of memory cells of the memory system based at least in part on identifying the one or more operating conditions associated with the block of memory cells of the memory system.

In some examples, the at least one error for the block of memory cells of the memory system is a correctable error. In some examples, the one or more operating conditions associated with the block of memory cells of the memory system includes a temperature of the block of memory cells, a cycle count of the block of memory cells, a quantity of times the block of memory cells has failed, a bit error rate of the block of memory cells, or a quantity of blocks available in the memory system. In some examples, determining whether to retire the block of memory cells is based at least in part on the one or more operating conditions of the block of memory cells around a duration associated with identifying the at least one error.

Figure 5:
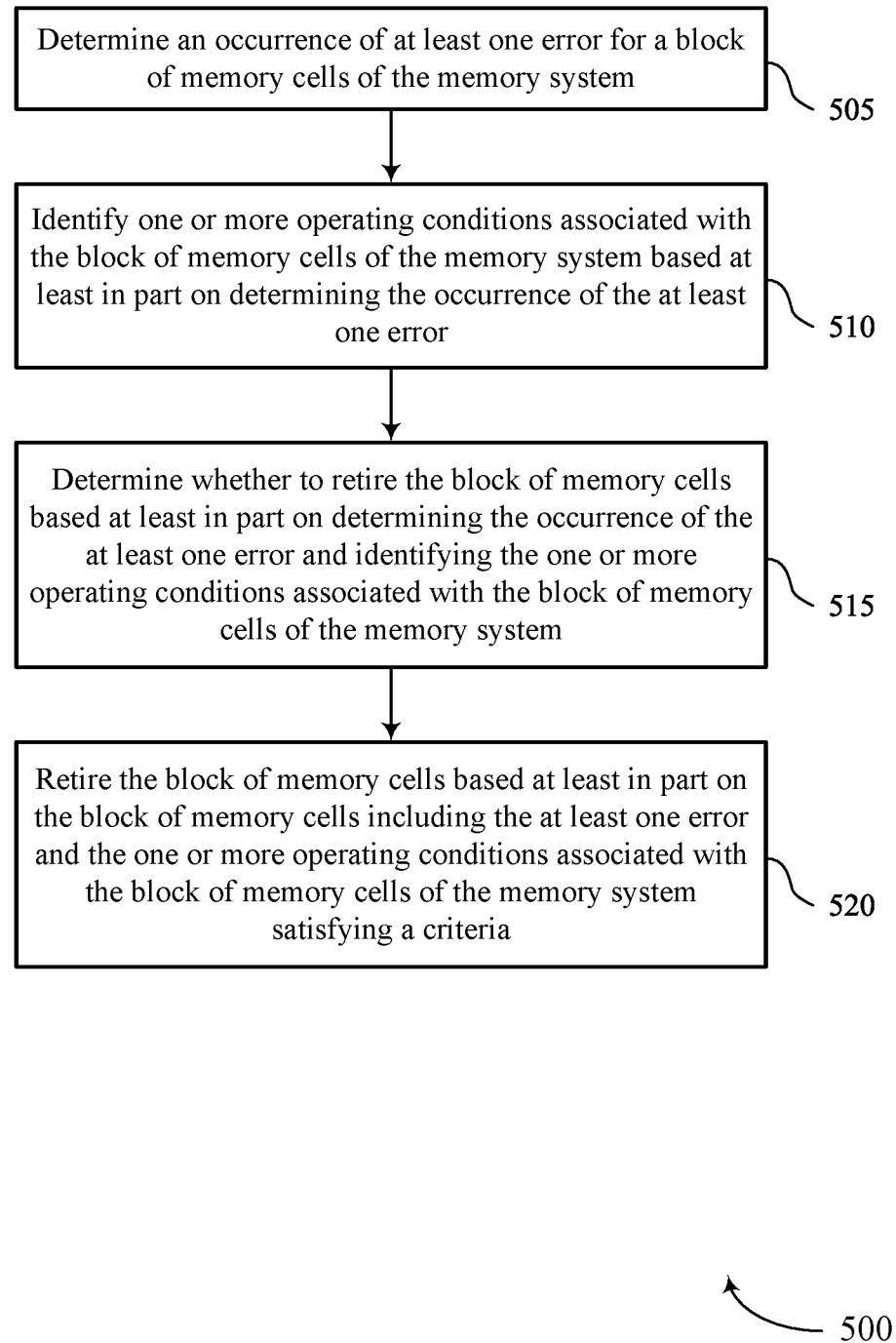
FIG. 5 shows a flowchart illustrating a method or methods that support techniques for retiring blocks of a memory system in accordance with examples as disclosed herein.

FIG. 5 shows a flowchart illustrating a method 500 that supports techniques for retiring blocks of a memory system in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 505, the method may include determining an occurrence of at least one error for a block of memory cells of the memory system. The operations of 505 may be performed in accordance with examples as disclosed herein. In some examples, aspects of the operations of 505 may be performed by a determination component 425 as described with reference to FIG. 4.

At 510, the method may include identifying one or more operating conditions associated with the block of memory cells of the memory system based at least in part on determining the occurrence of the at least one error. The operations of 510 may be performed in accordance with examples as disclosed herein. In some examples, aspects of the operations of 510 may be performed by an identification component 430 as described with reference to FIG. 4.

At 515, the method may include determining whether to retire the block of memory cells based at least in part on determining the occurrence of the at least one error and identifying the one or more operating conditions associated with the block of memory cells of the memory system. The operations of 515 may be performed in accordance with examples as disclosed herein. In some examples, aspects of the operations of 515 may be performed by a determination component 425 as described with reference to FIG. 4.

At 520, the method may include retiring the block of memory cells based at least in part on the block of memory cells including the at least one error and the one or more operating conditions associated with the block of memory cells of the memory system satisfying a criteria. The operations of 520 may be performed in accordance with examples as disclosed herein. In some examples, aspects of the operations of 520 may be performed by a block retiring component 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for determining an occurrence of at least one error for a block of memory cells of the memory system, identifying one or more operating conditions associated with the block of memory cells of the memory system based at least in part on determining the occurrence of the at least one error, determining whether to retire the block of memory cells based at least in part on determining the occurrence of the at least one error and identifying the one or more operating conditions associated with the block of memory cells of the memory system, and retiring the block of memory cells based at least in part on the block of memory cells including the at least one error and the one or more operating conditions associated with the block of memory cells of the memory system satisfying a criteria.

Some examples of the method 500 and the apparatus described herein may further include operations, features, circuitry, logic, means, or instructions for determining an occurrence of at least one error for a second block of memory cells of the memory system, identifying a second set of operating conditions associated with the second block of memory cells of the memory system based at least in part on determining the occurrence of the at least one error for the second block of memory cells, and refraining from retiring the second block of memory cells based at least in part on the second set of operating conditions associated with the block of memory cells of the memory system failing to satisfy a second criteria.

Some examples of the method 500 and the apparatus described herein may further include operations, features, circuitry, logic, means, or instructions for determining a second occurrence of at least one error for the second block of memory cells of the memory system after refraining from retiring the second block of memory cells and retiring second the block of memory cells based at least in part on the second block of memory cells including the second occurrence of the at least one error and the second set of operating conditions associated with the second block of memory cells of the memory system satisfying the second criteria.

Some examples of the method 500 and the apparatus described herein may further include operations, features, circuitry, logic, means, or instructions for determining the criteria based at least in part on identifying the one or more operating conditions associated with the block of memory cells of the memory system and comparing the one or more operating conditions associated with the block of memory cells of the memory system to the criteria, where determining whether to retire the block of memory cells may be based at least in part on comparing the one or more operating conditions associated with the block of memory cells of the memory system to the respective threshold value.

Some examples of the method 500 and the apparatus described herein may further include operations, features, circuitry, logic, means, or instructions for identifying a third operating condition associated with the block of memory cells of the memory system based at least in part on determining the occurrence of the at least one error and retiring the block of memory cells based at least in part on the one or more operating conditions associated with the block of memory cells of the memory system satisfying the criteria and the third operating condition satisfying a third criteria.

Some examples of the method 500 and the apparatus described herein may further include operations, features, circuitry, logic, means, or instructions for determining a third occurrence of at least one error for the block of memory cells of the memory system and refraining from retiring the block of memory cells based at least in part on the one or more operating conditions associated with the block of memory cells of the memory system failing to satisfy the criteria or the third operating condition failing to satisfy the criteria.

Some examples of the method 500 and the apparatus described herein may further include operations, features, circuitry, logic, means, or instructions for assigning a score to the block of memory cells of the memory system based at least in part on identifying the one or more operating conditions associated with the block of memory cells of the memory system and retiring the block of memory cells based at least in part on the score assigned to the block of memory cells of the memory system satisfying a respective threshold value.

In some examples of the method 500 and the apparatus described herein, the at least one error for the block of memory cells of the memory system may be a correctable error.

In some examples of the method 500 and the apparatus described herein, the one or more operating conditions associated with the block of memory cells of the memory system includes a temperature of the block of memory cells, a cycle count of the block of memory cells, a quantity of times the block of memory cells may have failed, a bit error rate of the block of memory cells, or a quantity of blocks available in the memory system.

In some examples of the method 500 and the apparatus described herein, determining whether to retire the block of memory cells may include operations, features, circuitry, logic, means, or instructions for determining whether a temperature of the block of memory cells satisfies a temperature threshold.

In some examples of the method 500 and the apparatus described herein, determining whether to retire the block of memory cells may include operations, features, circuitry, logic, means, or instructions for determining whether a quantity of access operations performed on the block of memory cells satisfies a cycle count threshold.

In some examples of the method 500 and the apparatus described herein, determining whether to retire the block of memory cells may include operations, features, circuitry, logic, means, or instructions for determining whether a quantity of errors, during a duration, for the block of memory cells satisfies an error threshold.

In some examples of the method 500 and the apparatus described herein, determining whether to retire the block of memory cells may include operations, features, circuitry, logic, means, or instructions for determining whether a bit error rate of the block of memory cells satisfies an error rate threshold.

In some examples of the method 500 and the apparatus described herein, determining whether to retire the block of memory cells may include operations, features, circuitry, logic, means, or instructions for determining whether a quantity of available blocks of memory cells of the memory system satisfies a threshold quantity of available blocks.

Some examples of the method 500 and the apparatus described herein may further include operations, features, circuitry, logic, means, or instructions for determining whether to retire the block of memory cells may be based at least in part on the one or more operating conditions of the block of memory cells around a duration associated with identifying the at least one error.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
    one or more memory devices comprising a block of memory cells; and processing circuitry coupled with the one or more memory devices and configured to cause the memory system to:
    determine an occurrence of at least one error for the block of memory cells;
    select one or more operating conditions of a plurality of operating conditions associated with the block of memory cells based at least in part on determining the occurrence of the at least one error;
    determine whether to retire the block of memory cells based at least in part on determining the occurrence of the at least one error and selecting the one or more operating conditions associated with the block of memory cells; and
    retire the block of memory cells based at least in part on the block of memory cells including the at least one error and the one or more operating conditions satisfying a respective criteria.

2. The memory system of claim 1, further comprising:
a second block of memory cells, wherein the processing circuitry is configured to cause the memory system to:
    determine an occurrence of at least one error for the second block of memory cells;
    identify a second set of operating conditions associated with the second block of memory cells based at least in part on determining the occurrence of the at least one error for the second block of memory cells; and
    refrain from retiring the second block of memory cells based at least in part on the second set of operating conditions associated with the block of memory cells failing to satisfy respective second criteria.

3. The memory system of claim 2, wherein the processing circuitry is configured to cause the memory system:
    determine a second occurrence of at least one error for the second block of memory cells after refraining from retiring the second block of memory cells; and
    retire second the block of memory cells based at least in part on the second block of memory cells including the second occurrence of the at least one error and the second set of operating conditions associated with the second block of memory cells satisfying the respective second criteria.

4. The memory system of claim 1, wherein the processing circuitry is configured to cause the memory system:
    determine the respective criteria based at least in part on selecting the one or more operating conditions associated with the block of memory cells; and
    compare the one or more operating conditions to the respective criteria, wherein determining whether to retire the block of memory cells is based at least in part on comparing the one or more operating conditions to a respective threshold value.

5. The memory system of claim 1, wherein the processing circuitry is configured to cause the memory system:
    identify a third operating condition associated with the block of memory cells based at least in part on determining the occurrence of the at least one error; and
    retire the block of memory cells based at least in part on the one or more operating conditions satisfying the respective criteria and the third operating condition satisfying a third criteria.

6. The memory system of claim 5, wherein the processing circuitry is configured to cause the memory system:
    determine a third occurrence of at least one error for the block of memory cells; and
    refrain from retiring the block of memory cells based at least in part on the one or more operating conditions failing to satisfy the respective criteria or the third operating condition failing to satisfy the respective criteria.

7. The memory system of claim 1, wherein the processing circuitry is configured to cause the memory system:
    assign a score to the block of memory cells based at least in part on selecting the one or more operating conditions; and
    retire the block of memory cells based at least in part on the score assigned to the block of memory cells satisfying a respective threshold value.

8. The memory system of claim 1, wherein the at least one error for the block of memory cells is a correctable error.

9. The memory system of claim 1, wherein the plurality of operating conditions associated with the block of memory cells comprises a temperature of the block of memory cells, a cycle count of the block of memory cells, a quantity of times the block of memory cells has failed, a bit error rate of the block of memory cells, or a quantity of blocks available.

10. The memory system of claim 1, wherein determining whether to retire the block of memory cells comprises:
    determining whether a temperature of the block of memory cells satisfies a temperature threshold.

11. The memory system of claim 1, wherein determining whether to retire the block of memory cells comprises:
    determining whether a quantity of access operations performed on the block of memory cells satisfies a cycle count threshold.

12. The memory system of claim 1, wherein determining whether to retire the block of memory cells comprises:
    determining whether a quantity of errors, during a duration, for the block of memory cells satisfies an error threshold.

13. The memory system of claim 1, wherein determining whether to retire the block of memory cells comprises:
    determining whether a bit error rate of the block of memory cells satisfies an error rate threshold.

14. The memory system of claim 1, wherein determining whether to retire the block of memory cells comprises:
    determining whether a quantity of available blocks of memory cells of the one or more memory devices satisfies a threshold quantity of available blocks.

15. The memory system of claim 1, wherein determining whether to retire the block of memory cells is based at least in part on a duration associated with identifying the at least one error.

16. A non-transitory computer-readable medium storing code comprising instructions which, when executed by one or more processors of a memory system, cause the memory system to:
    determine an occurrence of at least one error for a block of memory cells of the memory system;
    select one or more operating conditions of a plurality of operating conditions associated with the block of memory cells of the memory system based at least in part on determining the occurrence of the at least one error;
    determine whether to retire the block of memory cells based at least in part on determining the occurrence of the at least one error and selecting the one or more operating conditions associated with the block of memory cells of the memory system; and
    retire the block of memory cells based at least in part on the block of memory cells including the at least one error and the one or more operating conditions satisfying a respective criteria.

17. The non-transitory computer-readable medium of claim 16, wherein the instructions, when executed by the one or more processors of the memory system, cause the memory system to:
- determine an occurrence of at least one error for a second block of memory cells of the memory system;
- identify a second set of operating conditions associated with the second block of memory cells of the memory system based at least in part on determining the occurrence of the at least one error for the second block of memory cells; and
- refrain from retiring the second block of memory cells based at least in part on the second set of operating conditions associated with the block of memory cells of the memory system failing to satisfy respective second criteria.

18. The non-transitory computer-readable medium of claim 17, wherein the instructions, when executed by the one or more processors of the memory system, cause the memory system to:
- determine a second occurrence of at least one error for the second block of memory cells of the memory system after refraining from retiring the second block of memory cells; and
- retire second the block of memory cells based at least in part on the second block of memory cells including the second occurrence of the at least one error and the second set of operating conditions associated with the second block of memory cells satisfying the respective second criteria.

19. The non-transitory computer-readable medium of claim 16, wherein the instructions, when executed by the one or more processors of the memory system, cause the memory system to:
- determine the respective criteria based at least in part on selecting the one or more operating conditions associated with the block of memory cells; and
- compare the one or more operating conditions to the respective criteria, wherein determining whether to retire the block of memory cells is based at least in part on comparing the one or more operating conditions to a respective threshold value.

20. The non-transitory computer-readable medium of claim 16, wherein the instructions, when executed by the one or more processors of the memory system, cause the memory system to:
- identify a third operating condition associated with the block of memory cells based at least in part on determining the occurrence of the at least one error; and
- retire the block of memory cells based at least in part on the one or more operating conditions satisfying the respective criteria and the third operating condition satisfying a third criteria.

21. The non-transitory computer-readable medium of claim 20, wherein the instructions, when executed by the one or more processors of the memory system, cause the memory system to:
- determine a third occurrence of at least one error for the block of memory cells; and
- refrain from retiring the block of memory cells based at least in part on the one or more operating conditions failing to satisfy the respective criteria or the third operating condition failing to satisfy the respective criteria.

22. The non-transitory computer-readable medium of claim 16, wherein the instructions, when executed by the one or more processors of the memory system, cause the memory system to:
- assign a score to the block of memory cells of the memory system based at least in part on selecting the one or more operating conditions; and
- retire the block of memory cells based at least in part on the score assigned to the block of memory cells of the memory system satisfying a respective threshold value.

23. The non-transitory computer-readable medium of claim 16, wherein the at least one error for the block of memory cells of the memory system is a correctable error.

24. The non-transitory computer-readable medium of claim 16, wherein the plurality of operating conditions associated with the block of memory cells of the memory system comprises a temperature of the block of memory cells, a cycle count of the block of memory cells, a quantity of times the block of memory cells has failed, a bit error rate of the block of memory cells, or a quantity of blocks available in the memory system.

25. A method performed by a memory system, the method comprising:
- determining an occurrence of at least one error for a block of memory cells of the memory system;
- selecting one or more operating conditions of a plurality of operating conditions associated with the block of memory cells of the memory system based at least in part on determining the occurrence of the at least one error;
- determining whether to retire the block of memory cells based at least in part on determining the occurrence of the at least one error and selecting the one or more operating conditions associated with the block of memory cells of the memory system; and
- retiring the block of memory cells based at least in part on the block of memory cells including the at least one error and the one or more operating conditions satisfying a respective criteria.

* * * * *